United States Patent [19]

Kennett et al.

[11] 4,001,727
[45] Jan. 4, 1977

[54] POWER CONTROL CIRCUIT FOR A POWER OSCILLATOR

[75] Inventors: Barrington George Kennett; Adrian Ernest Miller, both of Paignton, England

[73] Assignee: International Standard Electric Corporation, New York, N.Y.

[22] Filed: Nov. 7, 1975

[21] Appl. No.: 630,117

[30] Foreign Application Priority Data

Dec. 3, 1974 United Kingdom ............ 52247/74

[52] U.S. Cl. .............................. 331/182; 331/186
[51] Int. Cl.² .......................................... H03B 3/14
[58] Field of Search ......... 331/182, 183, 185, 186, 331/167–171; 219/10.55 B, 10.75, 10.77

[56] References Cited

UNITED STATES PATENTS 2,659,009  11/1953  Emslie ........................ 331/182 X

FOREIGN PATENTS OR APPLICATIONS 1,390,815  4/1975  United Kingdom ............... 331/182

Primary Examiner—Siegfried H. Grimm
Attorney, Agent, or Firm—John T. O'Halloran; Thomas M. Marshall

[57] ABSTRACT

Control of the gate electrode of a magnetic-beam-triode oscillator is effected by a diode connected between the gate and a controllable shunt regulator. The regulator is varied by a voltage derived from a differential amplifier forming part of a closed loop feedback circuit including the oscillator. By introducing an additional differential amplifier, variation of the regulator may also be made to depend on one of several parameters of the oscillator and load circuit, for example on the r.f. tank circuit voltage.

4 Claims, 4 Drawing Figures

POWER CONTROL CIRCUIT FOR A POWER OSCILLATOR

This invention relates to power control arrangements for power oscillators.

According to the present invention there is provided a power control arrangement suitable for controlling the power output of an oscillator circuit incorporating a magnetically-beamed power valve, the control arrangement comprising a rectifier for coupling to a control grid of the valve, a differential amplifier connected to control the catching voltage of the rectifier, a manually adjustable reference potential source connected to control one input of the differential amplifier to set the power output level and a feedback connection from said rectifier to a second input of the differential amplifier to stabilise the catching voltage.

Figure 1:
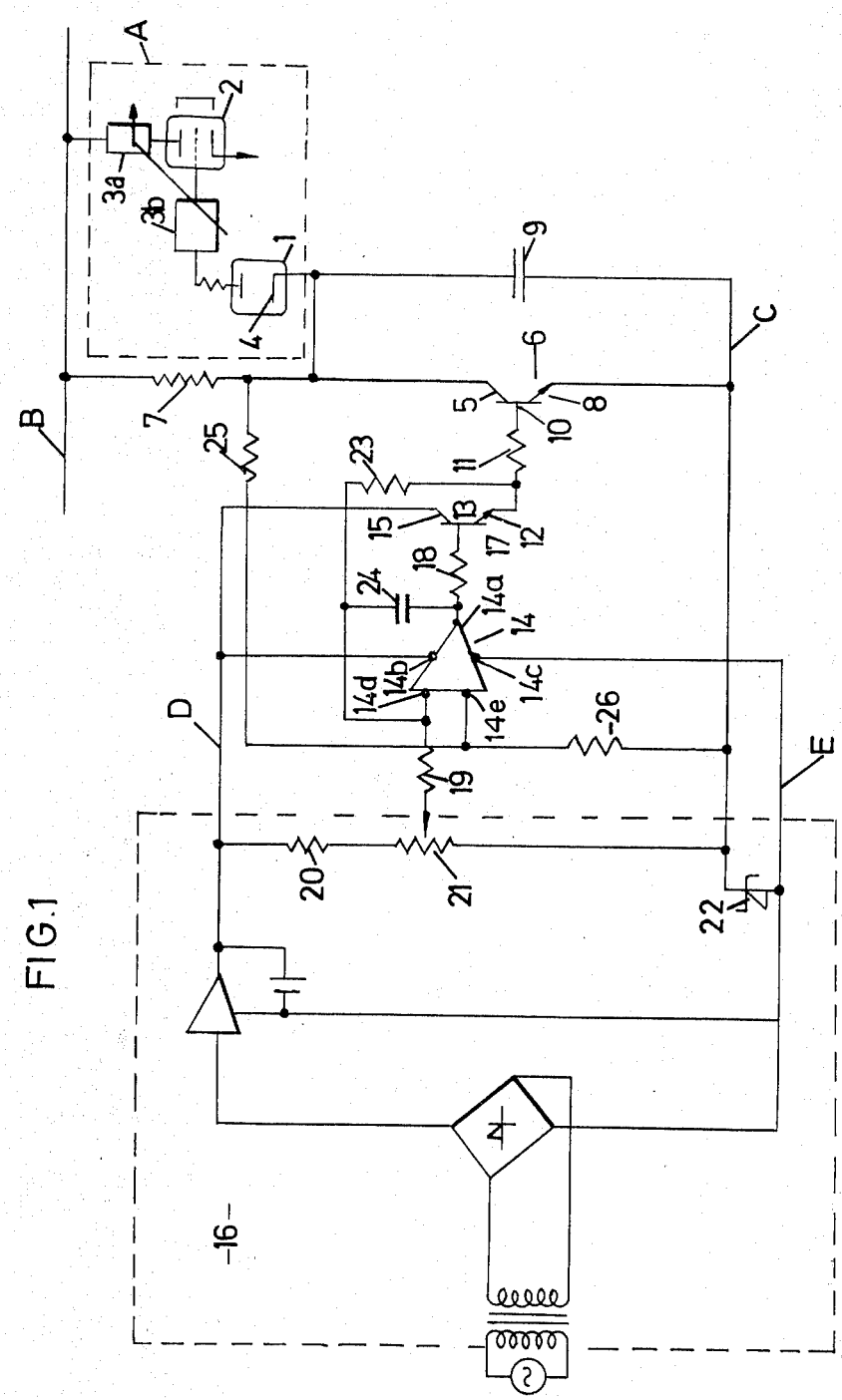
Figure 2:
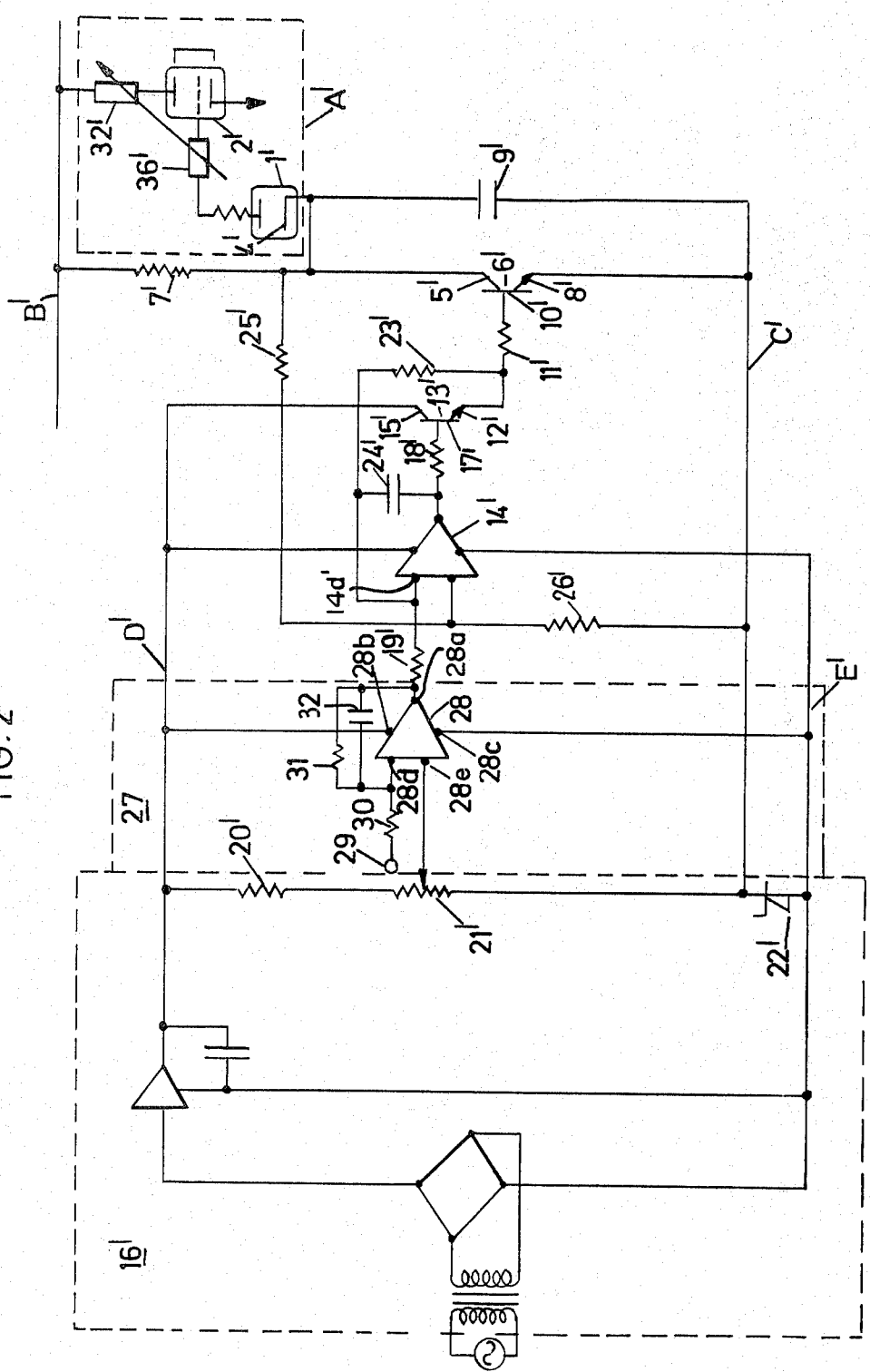
Figure 3A:
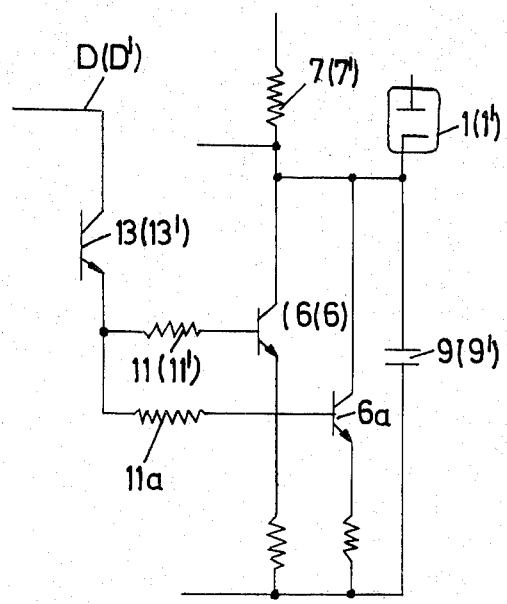
Figure 3B:
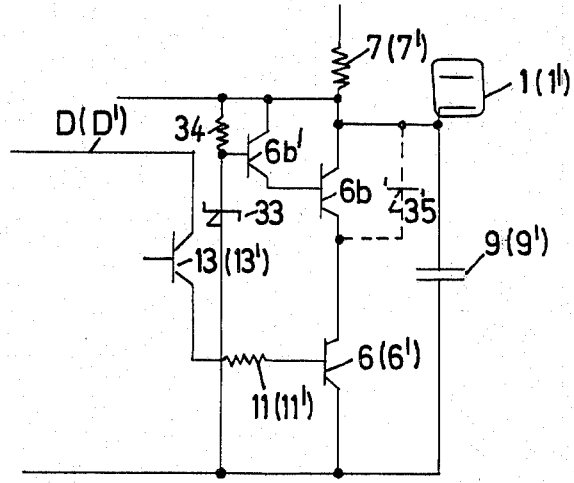

Embodiments of the invention are described below with reference to the accompanying drawings, of which:

FIG. 1 shows the circuit of a first embodiment;
FIG. 2 shows the circuit of a second embodiment incorporating an extra stage of feedback amplification; and
FIGS. 3a and 3b show modifications applicable to either embodiment.

In the prior art British Pat. No. 1,390,815 (B. G. Kennett 1) there is described a power control arrangement for a power oscillator (as used in induction heating) whereby the anode of a diode is attached to the control grid of the oscillator tube and the diode's cathode is connected to a low-impedance voltage "sink" which can be so varied as to control the grid current of the oscillator tube. The arrangements described below are realisations of such a variable, low-impedance voltage "sink".

Within the box A shown in dashed lines in FIG. 1 is shown a diode 1, of which the anode is connected to the grid of a power oscillator tube 2. The oscillation sustaining parts of the oscillatory circuit are indicated by coupled blocks 3a and 3b. As was disclosed in the aforementioned application the power output of the oscillator can be controlled by varying the voltage of the diode's cathode 4. To this end, cathode 4 is connected to the junction of the collector 5 of a transistor 6, and of resistor 7. The other end of resistor 7 is connected to rail B of the voltage supply to the oscillator, while the emitter 8 of transistor 6 is connected to the other rail C, and a capacitor 9 is connected from collector 5 to emitter 8.

The base 10 of transistor 6 is connected through a resistor 11 to the emitter 12 of a transistor 13, which acts as emitter-follower for the output of differential amplifier 14. The collector 15 of transistor 13 is connected to rail D of a power-supply unit 16, which is of conventional design and will not be detailed herein. The base 17 of transistor 13 is connected, through resistor 18 to the output terminal 14a of differential amplifier 14. At terminals 14b and 14c the amplifier is connected to the rails D and E respectively of power-supply 16. Terminal 14d is the inverting input to the amplifier and is connected through resistor 19 to a variable point on the potential dividing chain comprising resistor 20, potentiometer 21, and stabilizing diode 22, between the power-supply rails D and E; the variable point to which resistor 19 is connected is the sliding contact of potentiometer 21. The junction between potentiometer 21 and diode 22 is earthed and is connected to oscillator supply rail C. Also connected to terminal 14d are one end of each of resistor 23 and capacitor 24. The other end of resistor 23 is connected to emitter 12 and the other end of capacitor 24 is connected to terminal 14a and these form a negative feedback network which, together with the setting of the slider on potentiometer 21, determines the overall gain of the amplifier and emitter follower combination. To compensate for variations of voltage at the cathode 4 of diode 1, a further feed-back signal is applied to non-inverting input terminal 14e from the junction between the resistors 25 and 26, the other ends of which are respectively connected to cathode 4 of diode 1, and to rail C.

In FIG. 2 is shown an extension or refinement of the embodiment of FIG. 1. A further stage of feedback amplification 27 is added between the power supply unit and the differential amplifier with emitter follower. Those elements of the circuit in FIG. 2 which are the same as in FIG. 1 are indicated by the same reference number primed.

The inverting input 14d' of differential amplifier 14' is now connected through resistor 19', not to the sliding contact of potentiometer 21' but to the output terminal 28a of differential amplifier 28. At terminals 28b and 28c the amplifier is connected to the rails D' and E' respectively. The inverting input 28d is connected to a terminal 29 through resistor 30, by which terminal an external feed-back signal can be applied to the arrangement in order to compensate for variation of a particular parameter of the oscillator; for examples: anode current, r.f. tank circuit voltage, r.f. load current, or load temperature. An R-C network comprising resistor 31 and capacitor 32 also gives feedback from the output 28a to input 28d. The non-inverting input 28e is connected to the sliding contact of potentiometer 21'.

By the first embodiment, compensation is made for variation of the voltage at the cathode of the diode 1, while by the second embodiment compensation is made for variation of the voltage at the cathode of the diode 1' and also for any other parameter which is represented by a signal injected into the circuit at terminal 29.

Where current handling capacity requires it the stage containing transistor 6(6') may be supplemented by a similarly connected stage working in parallel with the first, and containing the transistor 6a, as in FIG. 3a; while where voltage handling capacity requires it the stage containing transistor 6(6') may be supplemented by a stage working in series with the first, and containing, for example, a Darlington pair, transistors 6b and 6b', as in FIG. 3b.

In FIG. 3b, briefly at low voltages on the cathode 4(4') the diode 33 is non conducting and through resistor 34 and transistor 6b' the transistor 6b is turned fully on. If transistor 6(6') is turned off over resistor 11(11') current through transistors 6b and 6b' and resistor 34 diminish with a consequent rise of voltage at the base of transistor 6b'. Eventually diode 33 conducts and further rise of voltage is taken across the transistor 6b, which may if need be, be protected against over-voltages by one (or more) diodes 35 across it.

We claim:
1. A power control arrangement suitable for controlling the power output of an oscillator circuit incorporating a magnetically-beamed power valve, the control arrangement comprising a rectifier for coupling to a control grid of the valve, a differential amplifier connected to control the catching voltage of the rectifier, a manually adjustable reference potential source connected to control one input of the differential amplifier to set the power output level and a feedback connection from said rectifier to a second input of the differential amplifier to stabilise the catching voltage.

2. An arrangement as claimed in claim 1 in which said differential amplifier is preceded by a further differential amplifier, of which the output is connected to said one input of the first-mentioned differential amplifier, and an input of the second differential amplifier is controlled by the variable reference potential, whereby application to the other input of the further differential amplifier of a signal corresponding to some parameter of the oscillator will provide a desired compensation.

3. An arrangement as claimed in claim 2 comprising an amplifying stage preceding said rectifier, an emitter-follower inserted between the output of said first-mentioned differential amplifier and said stage, there being a gain controlling feedback network across said differential amplifier having an input derived from the output of said emitter follower.

4. A power control arrangement for a power oscillator which arrangement includes a voltage catching diode connected to the grid of a power-oscillator tube, the catching voltage thereof being set by a shunt regulator comprising a differential amplifier with negative feedback applied from the cathode of said catching diode to one input and an adjustable reference potential applied to the other input, said negative feedback serving to maintain said catching voltage at the value set by said adjustable reference potential.

* * * * *